United States Patent
Takewaki et al.

(10) Patent No.: US 7,728,432 B2
(45) Date of Patent: Jun. 1, 2010

(54) NARROW AND WIDE COPPER INTERCONNECTIONS COMPOSED OF (111), (200) AND (511) SURFACES

(75) Inventors: Toshiyuki Takewaki, Kawasaki (JP); Hiroyuki Kunishima, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 843 days.

(21) Appl. No.: 11/185,937

(22) Filed: Jul. 21, 2005

(65) Prior Publication Data

US 2006/0027931 A1   Feb. 9, 2006

(30) Foreign Application Priority Data

Aug. 5, 2004   (JP) ............... 2004-229779

(51) Int. Cl.
*H01L 23/48* (2006.01)
(52) U.S. Cl. .............. 257/751; 257/761; 257/762; 257/E23.011
(58) Field of Classification Search .......... 257/762, 257/751, 753, 758, 761, E23.011
See application file for complete search history.

(56) References Cited

U.S. PATENT DOCUMENTS

| | | | |
|---|---|---|---|
| 6,291,885 B1 | 9/2001 | Cabral, Jr. et al. | |
| 6,303,490 B1 | 10/2001 | Jeng | |
| 6,391,774 B1 | 5/2002 | Takewaki | |
| 6,709,970 B1 | 3/2004 | Park et al. | |
| 2004/0014312 A1* | 1/2004 | Kunishima et al. | .......... 438/637 |
| 2004/0094511 A1 | 5/2004 | Seo et al. | |

FOREIGN PATENT DOCUMENTS

| | | |
|---|---|---|
| EP | 1 345 270 | 9/2003 |
| JP | 2001-068475 | 3/2001 |
| JP | 2004-040022 | 2/2004 |

OTHER PUBLICATIONS

Japanese Patent Office issued a Japanese Office Action dated Aug. 4, 2009, Application No. 2004-229779.

* cited by examiner

*Primary Examiner*—Lex Malsawma
(74) *Attorney, Agent, or Firm*—Young & Thompson

(57) ABSTRACT

A semiconductor device includes: a semiconductor substrate; an insulating film provided on the semiconductor substrate; a plurality of copper interconnections provided on the same level in the insulating film. The copper interconnection includes: a first copper interconnection having a relatively narrow width; and a second copper interconnection having a relatively wide width. The first copper interconnection has the top surface thereof principally composed of copper, and the second copper interconnection has the top surface thereof principally composed of copper.

10 Claims, 11 Drawing Sheets

10um

US 7,728,432 B2

NARROW AND WIDE COPPER INTERCONNECTIONS COMPOSED OF (111), (200) AND (511) SURFACES

This application is based on Japanese patent application No. 2004-229779 the content of which is incorporated hereinto by reference.

DISCLOSURE OF THE INVENTION

1. Field of the Invention

The present invention relates to a semiconductor device applied with copper interconnection, and a method of fabricating the same.

2. Description of the Related Art

Cu interconnection is widely used in semiconductor devices in order to respond demands on faster operation of the devices. Exemplary semiconductor devices having multi-layered copper interconnection structures are described elsewhere in previous patents (Japanese Laid-Open Patent Publication No. 2001-68475, and U.S. Pat. No. 6,291,885).

FIG. 10A shows a structure of a conventional Cu interconnection, and FIG. 10B shows an exemplary surface orientation of the Cu interconnection in this structure. FIGS. 10A and 10B are sectional views schematically showing a structure of a copper interconnection. The aspect ratio herein is modified for the convenience of explanation, elongating the lateral direction. As shown in FIG. 10A, an etching stopper film 12 and an interconnection-isolating interlayer insulating film 13 are sequentially formed on a silicon substrate 11. Portions of the etching stopper film 12 and the interconnection-isolating interlayer insulating film 13 are removed, a barrier metal 15 preventing Cu diffusion is formed at the position of removal, and a Cu interconnection 16 is formed on the barrier metal 15. It is to be noted that a viahole layer on the Cu interconnection 16, a Cu interconnection layer continuously formed on the viahole layer, and a contact hole layer provided under the Cu interconnection are not illustrated.

An exemplary process of fabricating a conventional single damascene Cu interconnection structure will be described referring to FIGS. 11A to 11E.

First, on the silicon substrate 11, the etching stopper film 12 used for forming the interconnect trench, typically composed of SiN, SiC or SiCN is formed. Next, on the etching stopper film 12, the interconnection-isolating interlayer insulating film 13 is formed. In some cases where a low-k film is used for the interconnection-isolating interlayer insulating film 13, a hard mask composed of SiN or $SiO_2$ may be formed further thereon. Next, an interconnect trench 14 is formed in the interconnection-isolating interlayer insulating film 13, making use of a photolithographic technique and an etching technique (FIG. 11A).

Next, typically by using a PVD technique, the barrier metal film 14 typically composed of Ta/TaN is formed in the interconnect trench 14, and a Cu film is formed. Next, Cu is plated using an electroplating technique to thereby fill the interconnect trench 14 with Cu, and the plated film is then annealed at a temperature of 150° C. or above for growth of the grains. Next, a Cu interconnection 16 is formed typically by using a CMP technique (FIG. 11B).

Next, on the Cu interconnection 16, a barrier film 17 preventing Cu diffusion, typically composed of SiN, SiC, SiCN or the like, is formed typically by using a CVD technique. A via-isolating interlayer insulating film 18 is then formed. After the formation of the via-isolating interlayer insulating film 18, a viahole 19 is formed therein by a photolithographic technique and an etching technique (FIG. 11C).

Next, a barrier metal film 22 typically composed of Ta/TaN is formed in the viahole 19 by a PVD technique, and a Cu film is then formed. Next, the trench is filled with Cu by Cu electroplating, the plated film is annealed, and is then subjected to CMP to thereby form a via 21 (FIG. 11D).

Repetition of the processes shown in FIGS. 11A to 11B results in formation of the third copper interconnection layer, to thereby form Cu interconnections having the single damascene structure (FIG. 11E).

SUMMARY OF THE INVENTION

The conventional copper interconnection structure may, however, raise a phenomenon so-called stress-induced void (abbreviated as SIV, hereinafter), which has been demanded to be suppressed. SIV is a phenomenon of formation of large voids, and is more likely to occur particularly in the vicinity of an interface between the copper interconnection and the via plug connected on the top portion thereof. Generation of SIV undesirably results in contact failure or increase in the interconnection resistance, and considerably degrades reliability of the semiconductor device.

In order to suppress occurrence of SIV, the present inventors made thorough investigations into a mechanism of SIV generation, and reached an inference below. The voids generated in the copper interconnection can migrate along the boundary. Any stress applied to the copper interconnection can therefore induce migration of the voids towards specific regions in the copper interconnection, depending on a stress distribution profile. In the copper interconnection structure, the voids are accordingly concentrated and combined in the vicinity of the interface between the copper interconnection and the via plug connected to the top portion thereof, to thereby form large voids. This is a supposed mechanism of SIV generation.

The investigations by the present inventors revealed that Cu grains of Cu(111) orientation was rich in the conventional copper. Grains having this surface orientation are relatively small in size, and consequently have a relative large number of boundaries on the top surface of the copper interconnection. This allows the voids to migrate along the boundaries to reach close to the interface between the interconnection and the via plug, resulting in SIV. The present inventors thus conceived to suppress SIV by increasing the grain size and reducing the boundaries, to thereby inhibit concentration and combination of the voids. Configuration of the present invention will be explained below.

According to the present invention, there is provided a semiconductor device comprising a semiconductor substrate; an insulating film provided on the semiconductor substrate; and a plurality of copper interconnections provided on the same level in the insulating film; wherein the copper interconnection comprises a first copper interconnection having a relatively narrow width; and a second copper interconnection having a relatively wide width; the first copper interconnection having the top surface thereof principally composed of (111) surface of copper, and the second copper interconnection having the top surface thereof principally composed of (200) surface of copper.

In the present invention, the top surface of the second copper interconnection is configured by (200) surface of copper, exposing large grains and therefore having a smaller number of boundaries (grain boundaries). A copper grain having (200) surface on the top surface thereof typically has a grain size of approximately as large as several tens of micrometer. This means that almost no boundary can be found in the direction of line width, because width of the copper interconnection is generally only as wide as 0.1 μm to several tens of micrometer or around. As is clear from the above, the present invention is successful in distinctively reducing the grain boundaries which can serve as migration path for the voids, and therefore can effectively suppress the generation of SIV. The present invention can also effectively suppress electromigration, because the top surface of the first copper interconnection is configured by (111) surface of copper having a large density.

According to the present invention, there is also provided a method of fabricating a semiconductor device comprising: obtaining a semiconductor substrate, and forming thereon an insulating film; selectively removing the insulating film so as to form a first interconnect trench having a relatively narrow width, and a second interconnect trench having a relatively wide width; forming, by a sputtering process using a Ta target, a Ta film on the inner wall of the first interconnect trench and forming a TaN film on the inner wall of the second interconnect trench, in a nitrogen atmosphere without applying a substrate bias voltage; forming a copper film, by a plating process, so as to fill the first interconnect trench and the second interconnect trench; and annealing the copper film, and removing portions of the copper film formed outside the interconnect trenches, to thereby form a first copper interconnection in the first interconnect trench and form a second copper interconnection in the second interconnect trench.

According to the present invention, it is made possible to form a Ta film on the inner wall of the first interconnect trench and to form a TaN film on the inner wall of the second interconnect trench in a single process, by forming the films by a sputtering process in a nitrogen atmosphere without applying substrate bias voltage. The Ta film is more likely to have (111) surface of copper grown thereon, and the TaN film is more likely to have (200) surface of copper grown thereon. This makes it possible to stably obtain the above-described copper interconnection structure. In other words, it is made possible to stably form a structure in which an (111)-oriented copper film is provided to the narrow-width interconnect trench, and a (200)-oriented copper film is provided to the wide-width interconnect trench.

In the present invention, the (111)-oriented copper means copper having a surface orientation of (111) over the top surface thereof, and the (200)-oriented copper means copper having a surface orientation of (200) over the top surface thereof.

According to the present invention, there is still also provided a method of fabricating a semiconductor device comprising: obtaining a semiconductor substrate, and forming thereon an insulating film; selectively removing the insulating film so as to form a first interconnect trench having a relatively narrow width, and a second interconnect trench having a relatively wide width; forming, by a plating step, a plated film over the entire region of the top surface of the insulating film; and annealing the plated film, and removing portions of the plated film formed outside the interconnect trenches, to thereby form a first copper interconnection in the first interconnect trench and form a second copper interconnection in the second interconnect trench, wherein in the plating step, a first copper film is filled in the first interconnect trench at a relatively slow rate of film formation, and a second copper film is then filled in the second interconnect trench at a relatively rapid rate of film formation.

According to the present invention, it is made possible to form (111) surface of copper in the first interconnect trench and to form (200) surface of copper in the second interconnect trench in a continuous process, by filling the first interconnect trench with the first copper film at a relatively slow rate of film formation, and then by filling the second interconnect trench with the second copper film at a relatively rapid rate of film formation. This makes it possible to stably obtain the above-described copper interconnection structure. In other words, it is made possible to stably form a structure in which an (111)-oriented copper film is provided to the narrow-width interconnect trench, and a (200)-oriented copper film is provided to the wide-width interconnect trench.

According to the present invention, it is made possible to distinctively reduce the grain boundaries which can serve as migration path for the voids, to effectively suppress generation of SIV failure, and to provide a highly-reliable semiconductor device.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

Figure 1A:
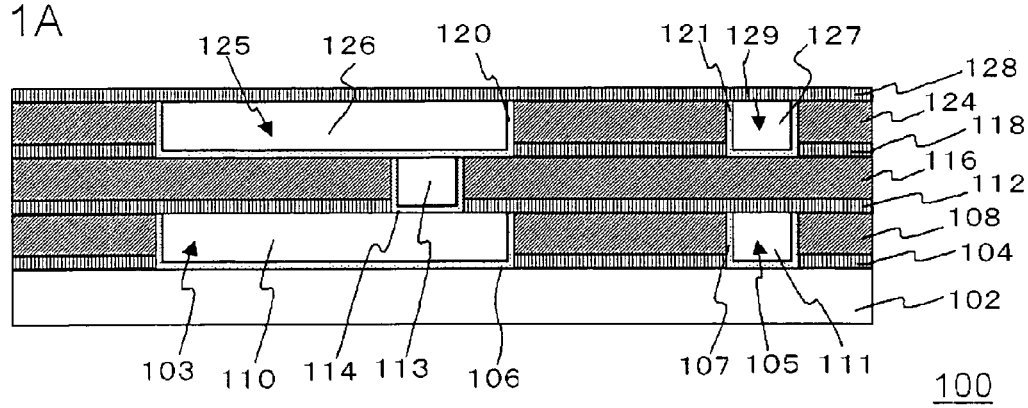
FIGS. 1A and 1B are sectional views schematically showing a structure of a semiconductor device of an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The following paragraphs will describe embodiments of the present invention referring to the attached drawings. In all drawings, any similar components will be given with similar reference numerals, omitting explanations for convenience. It is also to be noted that surface orientation in the context of the embodiments below is defined as the surface orientation of the top surface of the copper interconnection. It is still also to be noted that actually a large number of copper interconnections are provided, although only two copper interconnections per a single interlayer insulating film are illustrated in the embodiments below.

First Embodiment

Figure 1B:
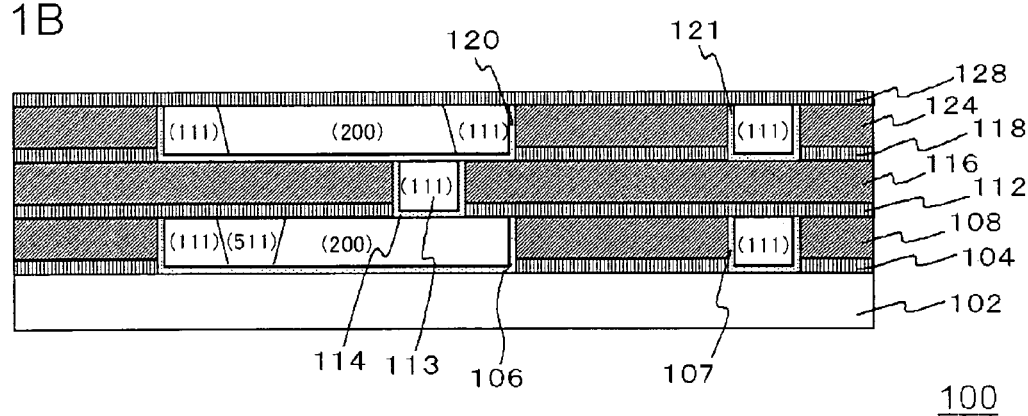

FIG. 1A is a sectional view explaining a structure of a semiconductor device 100 of this embodiment, and FIG. 1B is a sectional view explaining surface orientation of the copper interconnection of the semiconductor device 100.

As shown in FIG. 1A, the semiconductor device 100 has a single damascene structure in which the a multi-layered copper interconnection composed of first to third layers is provided on a semiconductor substrate 102 such as a silicon substrate. A second copper interconnection 110 and a first copper interconnection 111 in the first layer are configured by a second interconnect trench 103 and a first interconnect trench 105, provided in the interlayer insulating film 108 on an etching stopper film 104, having a copper film filled therein. There is a barrier metal 107, preventing Cu diffusion, placed between the interlayer insulating film 108 and the first copper interconnection 111. On the other hand, there is a barrier metal 106, preventing Cu diffusion, placed between the interlayer insulating film 108 and the second copper interconnection 110. The second copper interconnection 110 has, on the top portion thereof, a via 113 composing a part of the second layer connected thereto. The third layer is structured similarly to the first layer, and configured on the second layer. The second copper interconnection 126 in the third layer has, on the bottom portion thereof, a via 113 connected thereto. The second copper interconnection 110 and the first copper interconnection 111 are provided on the same level in the interlayer insulating film 108.

The etching stopper film 104 has a function of terminating thereon etching of the interconnect trench, and is typically composed of SiN, SiC, SiCN, SiON and so forth.

The interlayer insulating film 108 is typically composed of a $SiO_2$ film, or films of low-k materials such as SiOF, SiOC and MSQ (methyl silsesquioxane).

The barrier metal 106 and the barrier metal 120 are configured by a TaN film, and respectively formed so as to cover the inner wall of the second interconnect trench 103 and the inner wall of the second interconnect trench 125. On the barrier metal 106 and the barrier metal 120, respectively formed are the second copper interconnection 110 and the second copper interconnection 126.

The present invention is to configure the first copper interconnection having a relatively small width as having principally (111) surface of copper on the top surface thereof, and to configure the second copper interconnection having a relatively wide width as having principally (200) surface of copper on the top surface thereof. The second copper interconnection 110 and the second copper interconnection 126 in this embodiment correspond to the wide-width interconnection described in the above, and the first copper interconnection 111 and the first copper interconnection 127 correspond to the narrow-width interconnection described in the above.

The second copper interconnection 110 and the second copper interconnection 126 satisfy the conditions below. It is assumed herein that diameter of the via 113 as r, width of the second copper interconnection 110 and the second copper interconnection 126 as D, and height of the second copper interconnection 110 and the second copper interconnection 126 as C, wherein C/D being defined as aspect ratio:
  (i) line width D is 0.3 μm or larger;
  (ii) 3r<D; and
  (iii) C/D<0.5.

On the other hand, the first copper interconnection 111 and the first copper interconnection 127 satisfy the condition below:
  (i) line width is less than 0.3 μm.

Surface orientation of Cu of the individual top surfaces of the second copper interconnection 110, the first copper interconnection 111, the second copper interconnection 126, and the first copper interconnection 127 can be analyzed using an EBSP (electron back scattering pattern) technique.

The barrier metal 107 and the barrier metal 121 are configured by a Ta film, and are formed so as to cover the inner wall of the first interconnect trench 105, and the inner wall of the first interconnect trench 129, respectively. On the barrier metal 107 and barrier metal 121, the first copper interconnection 111 and the first copper interconnection 127 are formed.

The top surface of the second copper interconnection 110 and the top surface of the second copper interconnection 126 expose the grains of as very large as several tens of micrometer, whereas, the second copper interconnection 110 has a line width of only as small as 0.3 μm to several tens of micrometer, showing only a few boundaries in the direction of line width. This makes it possible to suppress SIV failure. The SIV failure refers to a conduction failure between a via and an interconnection, which occurs typically when voids induced by stress in a wide-width copper interconnection (approximately three times as large as the via diameter) migrate along the grain boundaries to concentrate right under the via, and combine with each other to thereby form large voids. Copper having a surface orientation of (200) is therefore used herein as copper having a large grain size and less boundaries, so that the top surface of the copper interconnection 110 and the top surface of the second copper interconnection 126 are principally configured by Cu(200) surface.

The top surface of the first copper interconnection 111 and the top surface of the first copper interconnection 127 are principally configured by Cu(111) surface, and the size of Cu grains composing the interconnection is 0.1 μm or less. Plane (111) herein is a surface orientation characterized by a close packing of atoms. The first copper interconnection 111 and the first copper interconnection 127 therefore has a larger density as compared with the copper interconnection configured by Cu(200) surface or the like. This makes it possible to improve the electromigration resistance.

The following paragraphs will describe process steps of fabricating the semiconductor device 100 of this embodiment, referring to FIG. 2A to FIG. 6C.

Figure 2A:
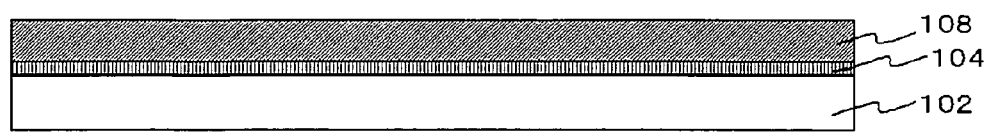
FIGS. 2A to 2C are sectional views schematically showing process steps of fabricating a semiconductor device of an embodiment.

First, the etching stopper film 104 is formed on the semiconductor substrate 102, and further thereon the interlayer insulating film 108 is formed (FIG. 2A). Illustrations of process steps of fabricating transistors on the semiconductor substrate are omitted.

Figure 2B:
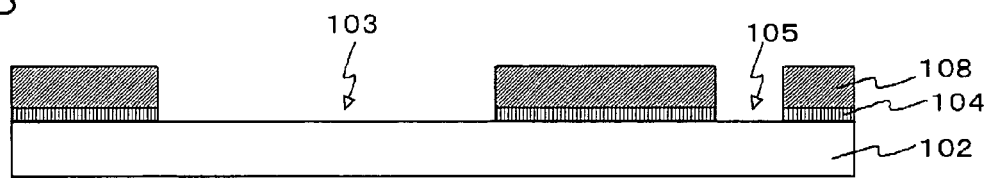

Next, the second interconnect trench 103 having a relatively wide width and the first interconnect trench 105 having a relatively small width are formed in the interlayer insulating film 108, using a photolithographic technique and an etching technique (FIG. 2B).

Figure 2C:
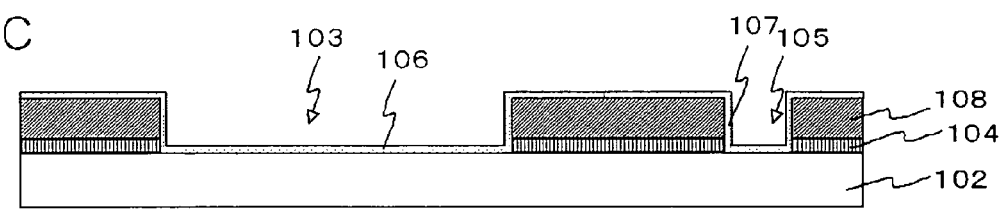

Next, the barrier metal 106 (TaN film) and the barrier metal 107 (Ta film) are formed on the interlayer insulating film 108, on the inner wall of the second interconnect trench 103, and on the inner wall of the first interconnect trench 105. In this embodiment, sputtering is adopted as a method of formation of the films, and the film formation is proceeded using a Ta target in a nitrogen gas atmosphere. Next, a copper seed layer (not shown) is formed. The barrier metal 106 and the barrier metal 107 herein are formed without applying bias voltage to the semiconductor substrate 102. According to findings of the present inventors, absence of substrate bias voltage makes nitrogen less likely to enter the first interconnect trench 105 having a relatively narrow width, so that the barrier metal 107 formed in the first interconnect trench 105 is configured principally by a Ta film. On the other hand, nitrogen is more likely to enter the second interconnect trench 103 having a relatively wide width as compared with the first interconnect trench 105, so that the barrier metal 106 formed in the second interconnect trench 103 is configured principally by a TaN film (FIG. 2C). Investigations by the present inventors revealed that the Ta film has a strong tendency of allowing an (111)-oriented copper film to grow thereon. The present inventors also found from the investigations that, on the barrier metal 106 configured principally by the TaN film, the copper film formed by a plating process and so forth is likely to have a surface orientation of (200) by annealing. This is supposedly because the TaN film is nearly amorphous, so that the copper film formed thereon also becomes amorphous, which means that the copper film, possibly converted later to have a surface orientation of (200) after being annealed, can more readily be formed.

Next, copper is plated over the entire top surface of the interlayer insulating film 108, and on the barrier metal 106 and the barrier metal 107 by electroplating. In this embodiment, copper is plated initially under supply of a low current for a relatively long duration of time, then counter etching the copper film under current supply in the direction opposite to that of the low current, and then depositing copper by plating under a high current for a relatively short duration of time.

Figure 3A:
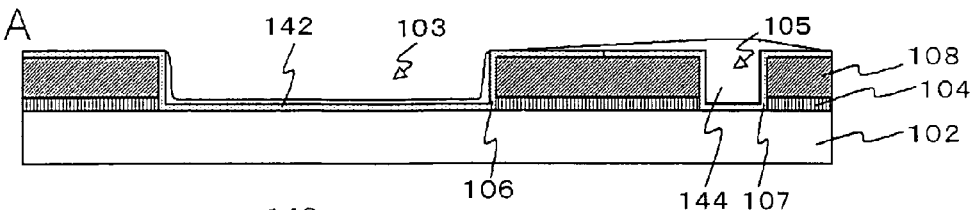
FIGS. 3A to 3D are sectional views schematically showing process steps of fabricating a semiconductor device of an embodiment.
Figure 3B:
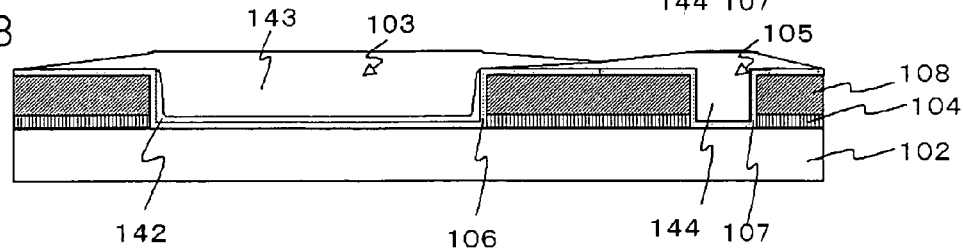

In this embodiment, a low current as small as one ampere or around is supplied for 110 seconds or around. A first copper film 144 is thus filled in the narrow-width first interconnect trench 105. The wide-width second interconnect trench 103 in this process has a thin plated film of a copper film 142 formed on the surficial portion thereof, but is never filled completely (FIG. 3A). Next, a current of as large as 6.32 A is supplied for 1.5 seconds or around in the counter direction of the low current, to thereby effect counter etching. Next, a high current as large as 30 A or around is supplied for 13 seconds in the direction same as that of the low current. This results in complete filling of the wide-width second interconnect trench 103 with a second copper film 143 (FIG. 3B). The plating initially carried out using a low current at a relatively slow rate of film formation is successful in forming the first copper film 144 likely to have a surface orientation of (111) after annealing, in the first interconnect trench 105. The succeeding plating using a high current at a relatively rapid rate of film formation is successful in filling the second interconnect trench 103 with the second copper film 143. In this process, the second copper film 143 is less likely to incorporate impurities by virtue of its rapid rate of film formation. This makes it possible, after annealing, to form a copper film having an increased grain size and likely to have a surface orientation of (200). Comparison between an accumulated value of current during the low current supply and an accumulated value of current during the high current supply reveals that the latter is larger. It is to be noted herein, that the accumulated value of current means a product of current value and a duration of time of current supply.

Figure 3C:
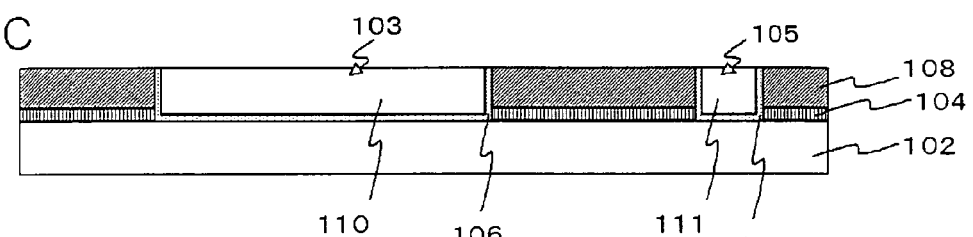

Next, the second copper film 143 is annealed at a temperature of 150° C. or above, to thereby grow the grains, and to convert the top surface thereof to have surface orientation (200). This consequently makes the top surface of the second copper film 143, filling the second interconnect trench 103, have giant grains as large as several tens of micrometer. The second copper film 143 therefore has only a few boundaries. Next, portions of the copper film formed outside the second interconnect trench 103 and the first interconnect trench 105 are removed by CMP. The second copper interconnection 110 and the first copper interconnection 111 are thus formed (FIG. 3C). The second copper interconnection 110 has only a few boundaries in the direction of line width, because copper composing the top surface of the second copper interconnection 110 has giant grains as large as several tens of micrometer.

Figure 3D:
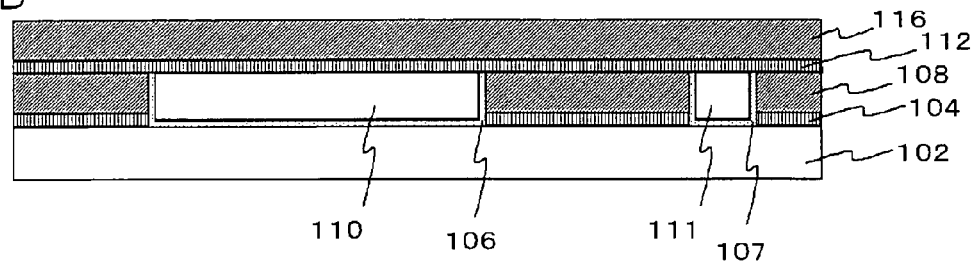

Next, the etching stopper film 112 is formed, and further thereon a via-isolating interlayer insulating film 116 is formed (FIG. 3D).

Figure 4A:
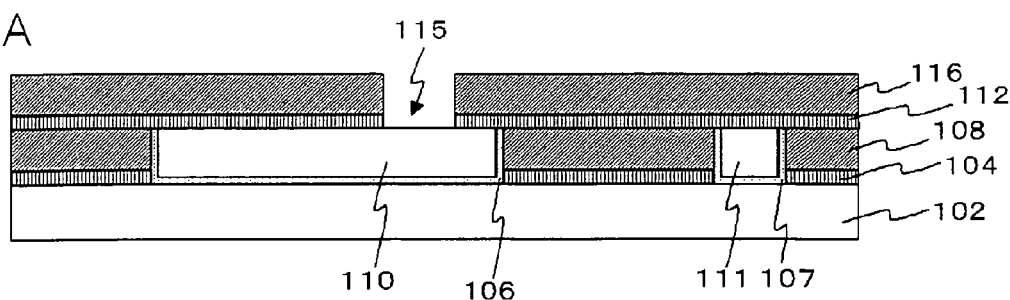
FIGS. 4A to 4C are sectional views schematically showing process steps of fabricating a semiconductor device of an embodiment.

Next, a viahole 115 is formed in the via-isolating interlayer insulating film 116 using a photolithographic technique and an etching technique (FIG. 4A).

Figure 4B:
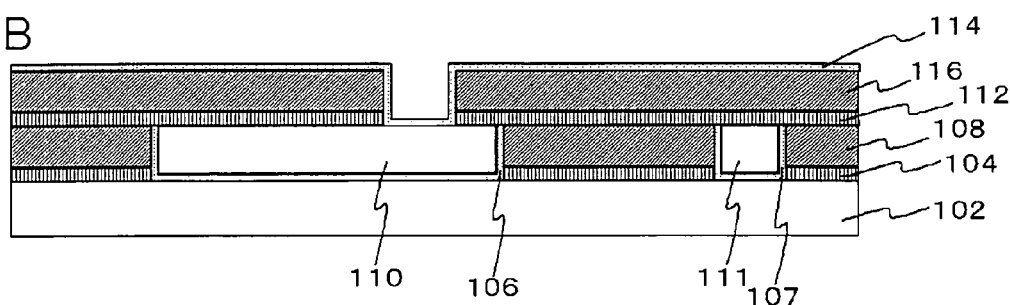

Next, a barrier metal 114 principally composed of a Ta film is formed in the viahole 115 (FIG. 4B). In this embodiment, a sputtering process is adopted as a method of film formation, and the film formation is proceeded using a Ta target. Next, a Cu seed layer (not shown) is formed.

Figure 4C:
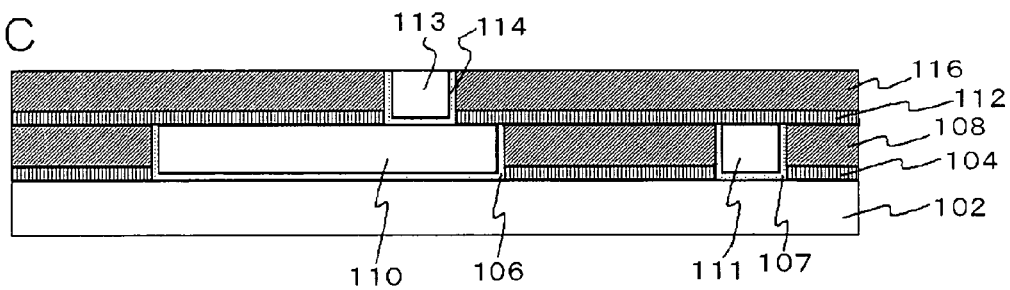

Next, Cu plating is carried out by an electroplating technique to thereby fill the viahole 115 with Cu, the product is annealed, and then further subjected to CMP to thereby form the via 113 (FIG. 4C). After annealing, the top surface of copper composing the via 113 has a surface orientation of principally (111).

Figure 5A:
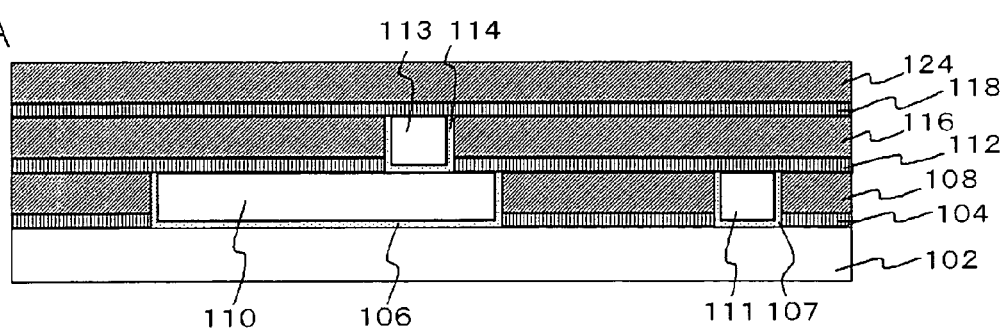
FIGS. 5A to 5C are sectional views schematically showing process steps of fabricating a semiconductor device of an embodiment.

Next, an etching stopper film 118 is formed, and further thereon the interlayer insulating film 124 is formed (FIG. 5A).

Figure 5B:
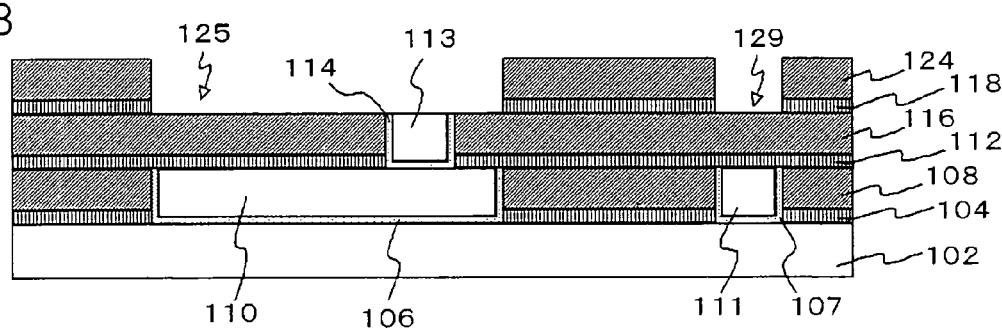

Next, the second interconnect trench 125 having a relatively wide width, and the first interconnect trench 129 having a relatively narrow width are formed in the interlayer insulating film 124, using a photolithographic technique and an etching technique (FIG. 5B).

Figure 5C:
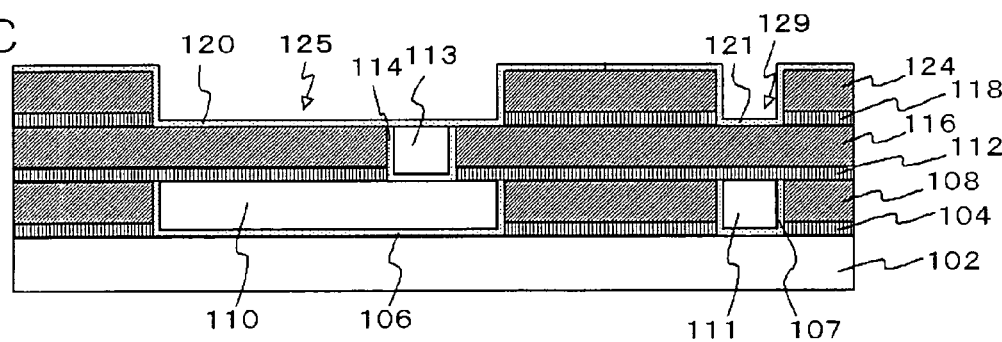

Next, similarly to the process steps of forming the first layer, the barrier metal 120 (TaN film) and the barrier metal 121 (Ta film) are formed on the interlayer insulating film 124, on the inner wall of the second interconnect trench 125, and on the inner wall of the first interconnect trench 129. A method of film formation adopted herein is a sputtering process using a Ta target proceeded in a nitrogen gas atmosphere. Next, a copper seed layer (not shown) is formed. The barrier metal 120 and the barrier metal 121 herein are formed without applying bias voltage to the semiconductor substrate 102, similarly to the process of fabricating the first layer (FIG. 5C). Similarly to the case of the first layer, the barrier metal 120 formed in the second interconnect trench 125, having a relatively wide width, is configured principally by a TaN film. On the other hand, the barrier metal 121 formed in the first interconnect trench 129 having a relatively narrow width is configured principally by a Ta film.

Figure 6A:
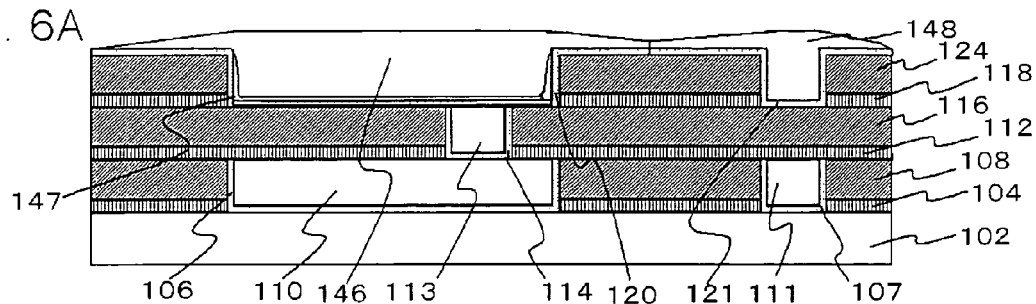
FIGS. 6A to 6C are sectional views schematically showing process steps of fabricating a semiconductor device of an embodiment.
Figure 6B:
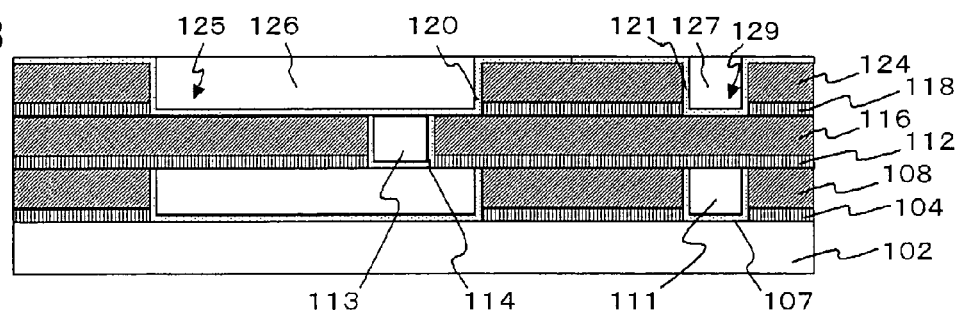

Next, using the electroplating technique similar to that used in the process of fabricating the first layer, a copper film 147, a second copper film 146 and a first copper film 148 are formed (FIG. 6A). Next, the second copper film 146 is annealed at a temperature of 150° C. or above, to thereby make the grains grow, and to make the surface orientation (200) appear on the top surface thereof. Next, portions of the copper film formed outside the second interconnect trench 125 and the first interconnect trench 129 are removed by CMP. The second copper interconnection 126 relatively wider in the width than the first copper interconnection 127, and the first copper interconnection 127 relatively narrower in the width than the second copper interconnection 126 are thus formed (FIG. 6B). The top surface of the second copper interconnection 126 herein comprise of giant grains having a grain size of as large as several tens of micrometer. The width of the second copper interconnection is 0.3 μm to several tens of micrometer. The second copper interconnection 126 therefore has only a few boundaries in the direction of line width.

Figure 6C:
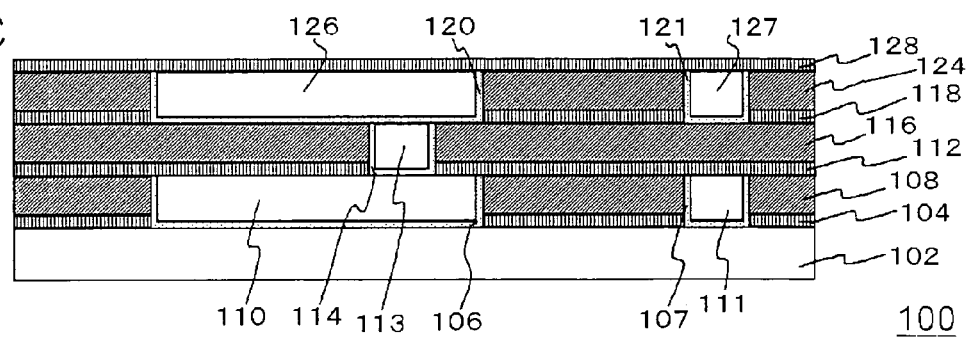

Next, an etching stopper film 128 is formed on the interlayer insulating film 124, the second copper interconnection 126, and the first copper interconnection 127 (FIG. 6C).

These processes finally gives the semiconductor device 100.

Next paragraphs will describe effects of the semiconductor device 100 and the method of fabricating the same according to this embodiment.

In this embodiment, copper grains as very large as several tens of micrometer appear on the top surfaces of the second copper interconnection 110 and the second copper interconnection 126, both having a relatively wider width. Because each of the second copper interconnection 110 and the second copper interconnection 126 have a line width of 0.3 µm to several tens of micrometer, there are only a few boundaries appear on the top surfaces of the second copper interconnection 110 and the second copper interconnection 126. This consequently reduces the boundaries, possibly serving as migration path for the voids, to a distinctive degree, and makes it possible to suppress condensation and combination of the voids at the interface between the via 113 and each of the second copper interconnection 110 and the second copper interconnection 126, and to thereby prevent large voids from generating. This is successful in effectively suppressing SIV.

In general, the SIV failure is recognized as a problem for the second copper interconnection 110 and the second copper interconnection 126 having a relatively wide width, whereas electromigration, rather than the SIV failure, is of a matter of significance for the first copper interconnection 111 and the first copper interconnection 127 having a relatively narrow width. This embodiment can solve these problems which reside in the narrow-width and wide-width copper interconnections at the same time. More specifically, in this embodiment, the copper interconnection having (200) orientation is formed in the wide-width interconnect trench, and the copper interconnection having (111) orientation is formed in the narrow-width interconnect trench. This makes it possible to suppress the SIV failure in the wide-width copper interconnections (second copper interconnection 110 and the second copper interconnection 126), and to suppress electromigration in the narrow-width copper interconnections (first copper interconnection 111 and the first copper interconnection 127).

In this embodiment, the barrier metal 106 (TaN film) is formed on the interlayer insulating film 108 and on the inner wall of the second interconnect trench 103, and the barrier metal 107 (Ta film) is formed on the interlayer insulating film 108 and on the inner wall of the first interconnect trench 105, without applying bias voltage to the semiconductor substrate, in a single process step, using a sputtering technique as a method of film formation, using Ta as a target in a nitrogen gas atmosphere. According to findings of the present inventors, nitrogen is less likely to enter the relatively narrow interconnect trenches (first interconnect trench 105 and the first interconnect trench 129), so that the barrier metal 107 and the barrier metal 121 composed of Ta are more readily formed therein. The Ta film is more likely to have an (111)-oriented copper film grown thereon, and consequently has the copper film having a surface orientation of (111) grown thereon after annealing. This makes it possible to suppress electromigration in the first copper interconnection 111 and the first copper interconnection 127. This is because the copper interconnection composed of copper having a high density and (111) orientation shows a high electromigration resistance. On the other hand, according to other findings of the present inventors, nitrogen is more likely to enter the relatively wide interconnect trenches (second interconnect trench 103 and the second interconnect trench 125), so that the barrier metal 106 and the barrier metal 120 principally composed of TaN are more readily formed therein. The TaN film is more likely to have a (200)-oriented copper film grown thereon. Because the TaN film has a near-amorphous crystal structure, the copper film formed thereon is supposedly more likely to have an amorphous structure. After annealing, a copper film having a surface orientation of (200) is formed on the TaN film. This makes it possible to suppress SIV failure in the wide-width copper interconnections (second copper interconnection 110 and second copper interconnection 126). This is because the copper grains are as large as several tens of micrometers, whereas the line width is only as large as 0.3 µm to several tens of micrometer, producing only a few boundaries in the direction of line width.

This embodiment also adopts a multi-step electroplating technique. First, the narrow-width interconnect trenches (first interconnect trench 105 and first interconnect trench 129) are completely buried by the first copper film 144 and the first copper film 148 by the low-current plating, and the copper film 142 and the copper film 147 are formed only to a small thickness on the surficial portion of the wide-width interconnect trenches (second interconnect trench 103 and second interconnect trench 125). After the counter etching for a short duration of time, the relatively wide interconnection trenches are completely filled with the second copper film 143 and the second copper film 146 by high-current plating. The initial adoption of the low-current plating makes it possible to form the (111)-oriented copper film in the narrow-width interconnect trenches. Plating using a high current and therefore under a high rate of film formation makes impurities less likely to be incorporated. The impurities mentioned herein refer to C (carbon), S (sulfur), O (oxygen) and so forth, contained in a leveler, a carrier and so forth in a plating bath. This way of film formation makes it possible to form (200)-oriented copper film in the wide-width interconnect trenches. After the second copper film 143 and the second copper film 146 are formed, the product is annealed and further subjected to CMP to thereby remove portions of the copper film formed outside the interconnect trenches. Thus-fabricated semiconductor device successfully suppresses electromigration in the narrow-width copper interconnections (first copper interconnection 111 and first copper interconnection 127). It makes also possible to suppress SIV in the wide-width copper interconnections (second copper interconnection 110 and second copper interconnection 126).

Second Embodiment

FIGS. 7A to 7D are sectional views explaining an exemplary method of fabricating the semiconductor device 100. In this embodiment, definitions for the relatively-wide interconnect trenches, relatively-narrow interconnect trenches, aspect ratio, via diameter and width of relatively-wide interconnect trenches comply with those for the first embodiment.

Figure 7A:
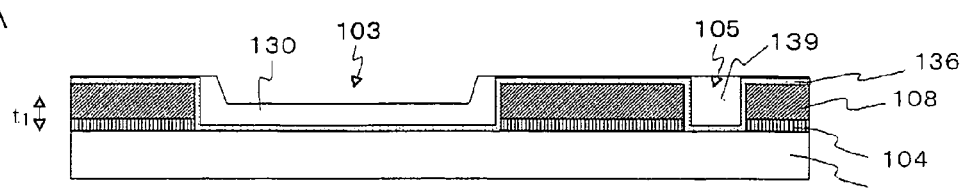
FIGS. 7A to 7D are sectional views schematically showing process steps of fabricating a semiconductor device of an embodiment.

First, after the process step explained in FIG. 2B in the first embodiment, a barrier metal 136 (Ta film) is formed on the interlayer insulating film 108, on the inner wall of the second interconnect trench 103, and on the inner wall of the first interconnect trench 105. This embodiment adopts a sputtering technique as a method of film formation, using a Ta target in a nitrogen gas atmosphere. Next, a seed layer (not shown) of copper is formed. Next, on the seed layer, a copper film 130 and a copper film 139 are formed by an electroplating technique (FIG. 7A). The first interconnect trench 105 herein is completely filled with an (111)-oriented copper film 139. On the other hand, the relatively-wide second interconnect trench 103 is filled with the copper film 130 only to a half depth or around. Thickness of the copper film 130 in the second interconnect trench 103 is now assumed as $t_1$.

Figure 7B:
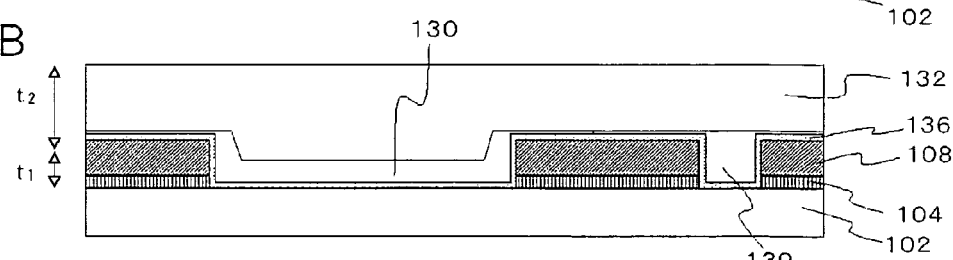

Next, a copper layer 132 is formed in a Cu sputtering chamber by a bias sputtering process. This embodiment adopts a sputtering process as a method of film formation, wherein the film formation is proceeded while applying a bias voltage to the semiconductor substrate 102 so that the surface of the growth is irradiated by argon ions. The copper layer 132 is thus formed on the copper film 130. Assuming now thickness of the copper layer 132 in the bias sputtering process as $t_2$, the bias sputtering is proceeded so as to adjust $t_2$ larger than $t_1$. In other words, the copper layer 132 is formed so as to keep $t_2 > t_1$ (FIG. 7B)

Figure 7C:
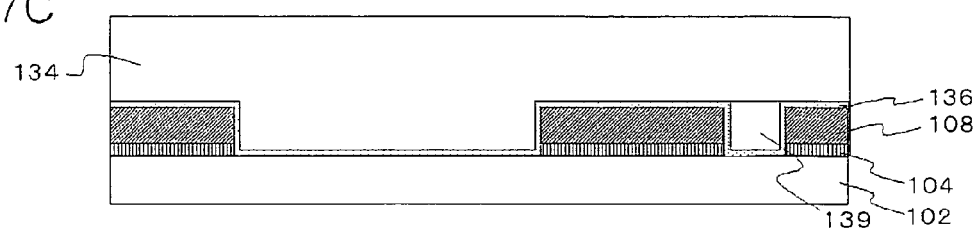

Next, the copper layer 132 and the copper film 130 formed by the bias sputtering process are then annealed for crystallinity control, in an argon atmosphere at 400° C. for 30 minutes. By the annealing, the copper layer 132 and the copper film 130 have surface orientations converted to (200), and giant grains of as large as several hundreds of micrometer are formed. This makes it possible to form a (200)-oriented single crystal copper film 134, having large grains and consequently having a less number of boundaries. The copper film 139 is subjected to annealing at a temperature of 150° C. or around. After the annealing, copper composing the top surface of the copper film 139 principally has a surface orientation of (111) (FIG. 7C).

Figure 7D:
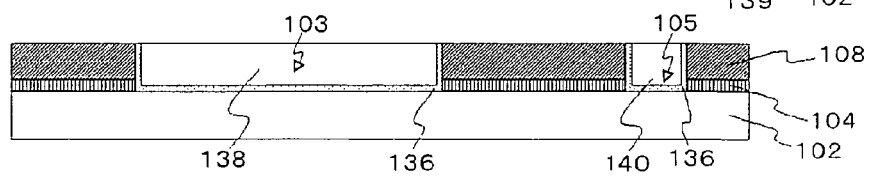

Next, the portions of copper deposited outside the second interconnect trench 103 and the first interconnect trench 105 are removed typically by CMP. The second copper interconnection 138 and the first copper interconnection 140 can thus be formed (FIG. 7D). Copper composing the top surface of the second copper interconnection 138 herein has giant grains of as large as several hundreds of micrometer, so that the second copper interconnection 138 has only a few boundaries in the direction of line width.

Next, formation of the copper interconnections out of the process steps explained in the first embodiment referring to FIGS. 3D to 6C, is carried out according to the method explained in this embodiment. The semiconductor device 100 can thus be completed.

The barrier metal, explained as being formed by a Ta film in this embodiment, may be replaced with any other barrier films such as W film, Ti film and Nb film.

The following paragraphs will describe effects of the method of fabricating the semiconductor device according to this embodiment.

In this embodiment, the copper film 130 and the copper layer 132 formed by the bias sputtering process are annealed at 400° C. or around. The bias-sputtered copper layer 132 and the copper film 130 have copper increased in the grain size, and have the surface orientation thereof converted to (200). The single crystal copper film having a less number of boundaries can thus be formed. This makes it possible to reduce the resistivity and to improve the electromigration resistance of the second copper interconnection 138.

Similarly to the first embodiment, also this embodiment can successfully suppress the SIV failure caused by concentration of the voids at the interface between the copper interconnection and the via at the second copper interconnection 138. This embodiment is also successful in suppressing the SIV failure and in suppressing electromigration in the narrow-width first copper interconnection 140.

The embodiments of the present invention which have been described in the above referring to the attached drawings are merely examples of the present invention, allowing adoption of other various configurations.

For example, the present invention may be applied to a semiconductor device having a dual damascene structure, although the above-described embodiment dealt with the semiconductor device 100 having a single damascene structure.

It is also allowable, in the first embodiment, to omit the step of supplying current in the counter direction between the low-current supply step and the high-current supply step, when the copper interconnections are formed by an electroplating technique over a plurality of steps.

EXAMPLE

Example 1

Using a method similar to that applied to the first embodiment, Ta films were formed in the relatively-narrow interconnect trenches, and TaN films were formed in the relatively-wide interconnect trenches. The copper films were buried in the narrow-width interconnect trenches by the low-current plating, and the copper films were buried in the wide-width interconnect trenches by the high-current plating. A multi-layered copper interconnection structure was fabricated so as to include the second copper interconnections having a width of as relatively wide as 10 μm were fabricated as the wide-width interconnect trenches, and the first copper interconnections having a width of as relatively narrow as 0.2 μm were fabricated as the narrow-width interconnect trenches. Most portions of the first copper interconnections were found to have (111)-surface orientation and (511)-surface orientation. Confirmation by an EBSP technique also revealed that most portions of the second copper interconnections were found to have (200)-surface orientation.

Figure 8:
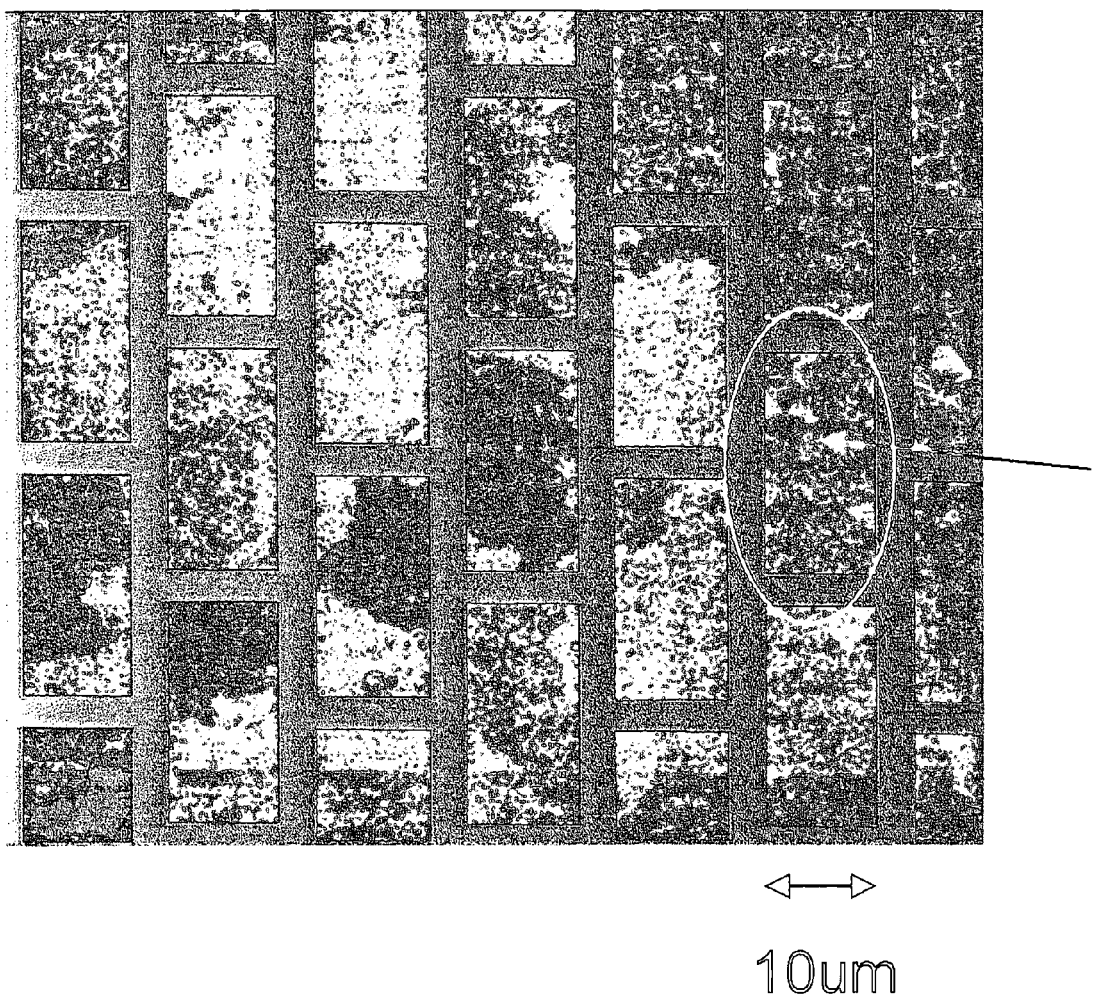
FIG. 8 is a view showing a structure of a semiconductor device of an embodiment.
Figure 9:
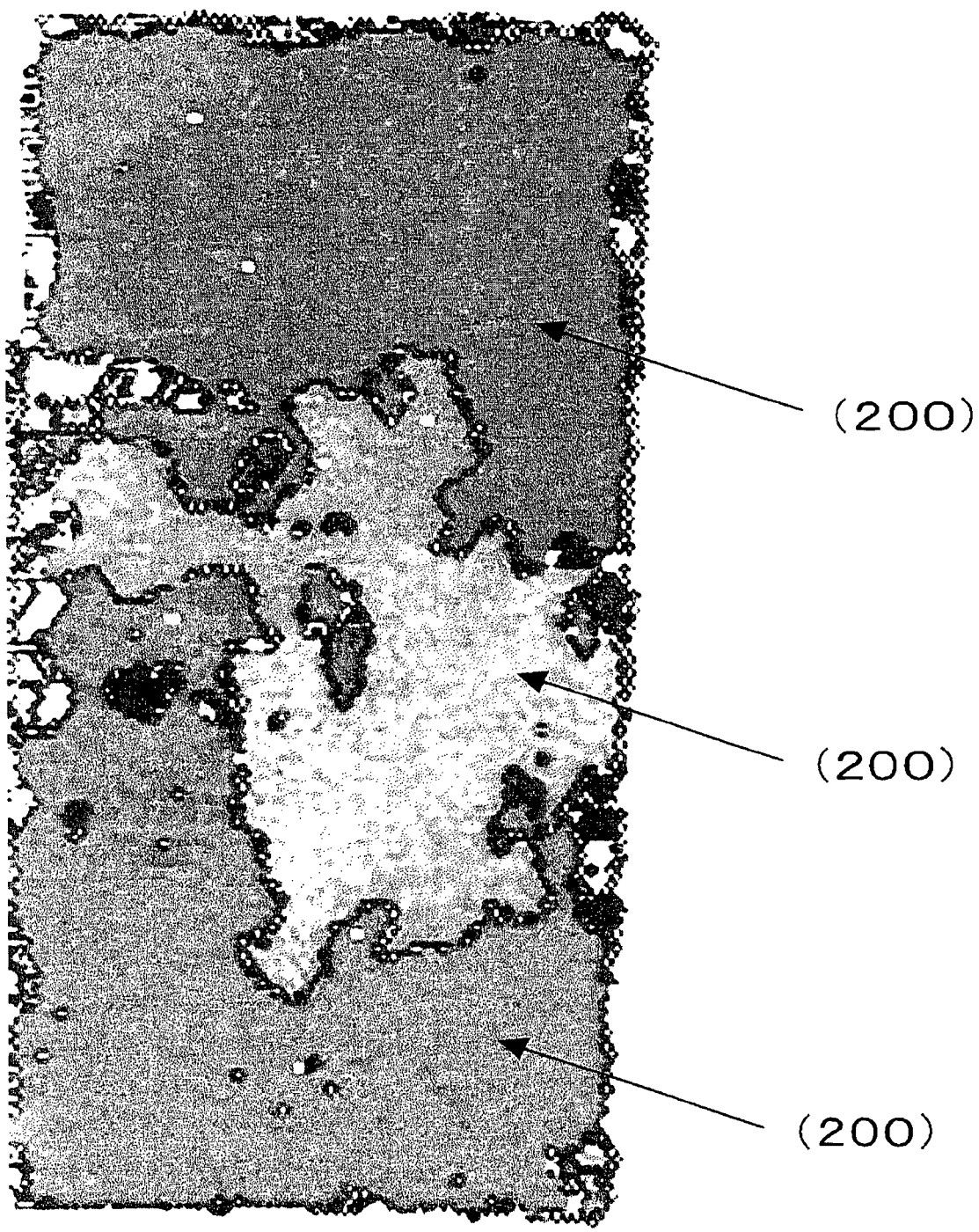
FIG. 9 is a view showing a structure of a semiconductor device of an embodiment.
Figure 10A:
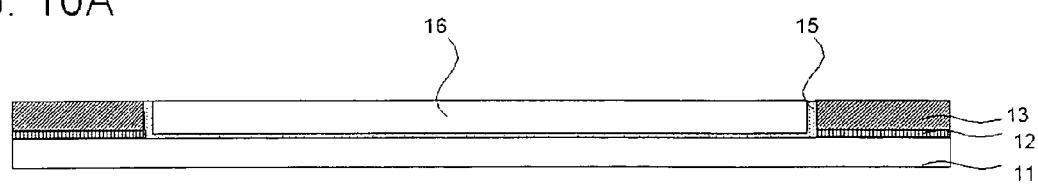
FIGS. 10A and 10B are sectional views schematically showing a structure of a semiconductor device according to a prior art.
Figure 10B:
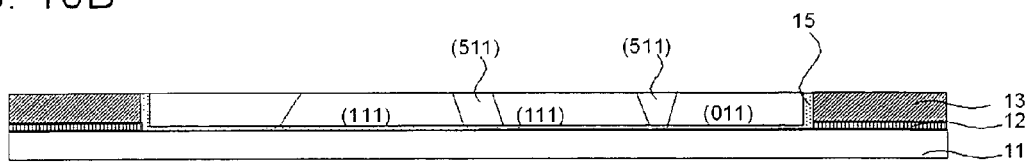
Figure 11A:
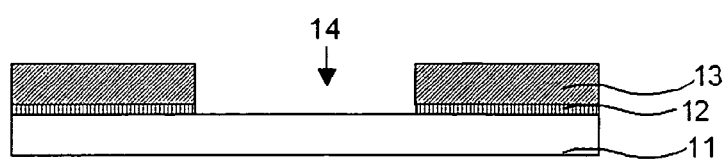
FIGS. 11A to 11E are sectional views schematically showing process steps of fabricating a semiconductor device according to a prior art.
Figure 11B:
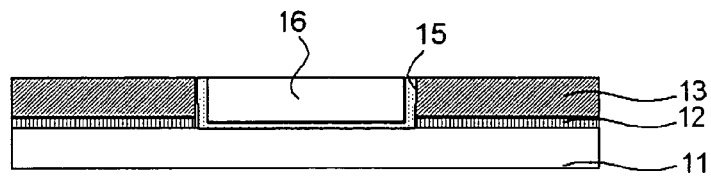
Figure 11C:
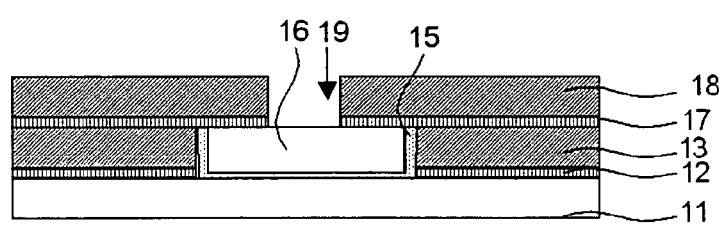
Figure 11D:
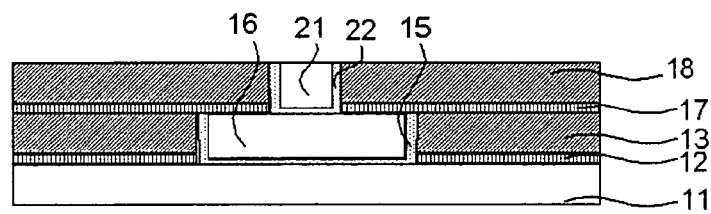
Figure 11E:
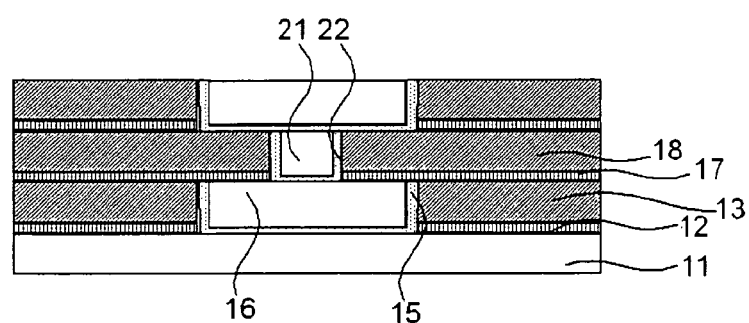

FIG. 8 shows a structure of the second copper interconnections formed in the interconnect trenches having a width of 10 μm by FIBSEM. FIG. 9 shows a portion indicated by the arrow in FIG. 8 by an EBSP technique. As shown in FIG. 9, most portion of the second copper interconnection of this embodiment was found to show (200)-surface orientation.

It is apparent that the present invention is not limited to the above embodiments, that may be modified and changed without departing from the scope and spirit of the invention.

What is claimed is:

1. A semiconductor device comprising:
    a semiconductor substrate;
    an insulating film provided on said semiconductor substrate;
    a plurality of copper interconnections provided on the same level in said insulating film; and
    a barrier metal provided between said copper interconnection and said insulating film,
    wherein said copper interconnection comprises:
    a first copper interconnection having a relatively narrow width; and
    a second copper interconnection having a relatively wide width;
    said first copper interconnection having a top surface thereof principally composed of (111) surface of copper, and said second copper interconnection having a top surface thereof principally composed of (200) surface of copper,
    wherein said barrier metal provided between said first copper interconnection and said insulating film is Ta film, and said barrier metal that is Ta film contacts with said first copper interconnection, and wherein said barrier metal provided between said second copper interconnection and said insulating film is TaN film, and said barrier metal that is TaN film contacts with said second copper interconnection.

2. The semiconductor device according to claim 1, wherein said first copper interconnection has a line width of less than 0.3 μm, and said second copper interconnection has a line width of 0.3 μm or more.

3. The semiconductor device according to claim 1, further comprising a via plug provided so as to be connected with the top surface of said second copper interconnection, satisfying a relation below:

$$3r<D$$

where, r represents a diameter of said via plug, and D represents a line width of said second copper interconnection.

4. The semiconductor device according to claim 1, satisfying a relation below:

$$C/D<0.5$$

where C represents a height of said second copper interconnection, and D represents a line width of said second copper interconnection.

5. The semiconductor device according to claim 1, wherein said second copper interconnection has a grain size approximately as large as several tens of μm, such that substantially no boundary is found in a direction of line width.

6. A semiconductor device comprising:
a semiconductor substrate;
an insulating film provided on said semiconductor substrate;
a plurality of copper interconnections provided on the same level in said insulating film; and
a barrier metal provided between said copper interconnection and said insulating film,
wherein said copper interconnection comprises:
a first copper interconnection having a relatively narrow width; and
a second copper interconnection having a relatively wide width;
said first copper interconnection having a top surface thereof principally composed of (111) and (511) surface of copper, and said second copper interconnection having a top surface thereof principally composed of (200) surface of copper,
wherein said barrier metal provided between said first copper interconnection and said insulating film is composed of Ta, and said barrier metal composed of Ta contacts with said first copper interconnection,
wherein said barrier metal provided between said second copper interconnection, and said insulating film is composed of TaN and said barrier metal composed of TaN contacts with said second copper interconnection,
wherein said barrier metal provided between said first copper interconnection and said insulating film is Ta film, and said barrier metal that is Ta film contacts with said first copper interconnection, and
wherein said barrier metal provided between said second copper interconnection and said insulating film is TaN film, and said barrier metal that is TaN film contacts with said second copper interconnection.

7. The semiconductor device according to claim 6, wherein said first copper interconnection has a line width of less than 0.3 μm, and said second copper interconnection has a line width of 0.3 μm or more.

8. The semiconductor device according to claim 6, further comprising a via plug provided so as to be connected with the top surface of said second copper interconnection, satisfying a relation below:

$$3r<D$$

where, r represents a diameter of said via plug, and D represents a line width of said second copper interconnection.

9. The semiconductor device according to claim 6, satisfying the relation below:

$$C/D<0.5$$

where C represents a height of said second copper interconnection, and D represents a line width of said second copper interconnection.

10. The semiconductor device according to claim 6, wherein said second copper interconnection has a grain size approximately as large as several tens of μm, such that substantially no boundary is found in a direction of line width.

* * * * *